(12) United States Patent
Lee et al.

(10) Patent No.: US 6,171,352 B1
(45) Date of Patent: Jan. 9, 2001

(54) CHEMICAL MECHANICAL ABRASIVE COMPOSITION FOR USE IN SEMICONDUCTOR PROCESSING

(75) Inventors: Tsung-Ho Lee, Ping Tong Hsien; Tsui-Ping Yeh, KaoHsung, both of (TW)

(73) Assignee: Eternal Chemical Co., Ltd. (TW)

( * ) Notice: Under 35 U.S.C. 154(b), the term of this patent shall be extended for 0 days.

(21) Appl. No.: 09/268,193

(22) Filed: Mar. 15, 1999

(30) Foreign Application Priority Data

Jul. 23, 1998 (CN) .................................................. 87112046

(51) Int. Cl.$^7$ ....................................................... C09G 1/02
(52) U.S. Cl. .................................. 51/307; 51/308; 51/309
(58) Field of Search ............................. 51/307, 308, 309; 106/3; 438/692, 693; 216/89; 252/79.1

(56) References Cited

U.S. PATENT DOCUMENTS

| | | | |
|---|---|---|---|
| 4,959,113 | * | 9/1990 | Roberts ................................. 156/636 |
| 5,084,071 | * | 1/1992 | Nenadic et al. ......................... 51/309 |
| 5,114,437 | * | 5/1992 | Takeuchi et al. ....................... 51/293 |
| 5,209,816 | * | 5/1993 | Yu et al. ............................... 156/636 |
| 5,225,034 | * | 7/1993 | Yu et al. ............................... 156/636 |
| 5,264,010 | * | 11/1993 | Brancaleoni et al. ................... 106/3 |
| 5,340,370 | * | 8/1994 | Cadien et al. ......................... 51/308 |
| 5,366,542 | * | 11/1994 | Yamada et al. ......................... 106/3 |
| 5,391,258 | * | 2/1995 | Brancaleoni et al. ............... 156/636 |
| 5,480,476 | * | 1/1996 | Cook et al. .............................. 106/3 |
| 5,516,346 | * | 5/1996 | Cadien et al. ......................... 51/309 |
| 5,527,423 | * | 6/1996 | Neville et al. ..................... 156/636.1 |
| 5,733,819 | * | 3/1998 | Kodama et al. ......................... 106/3 |
| 5,759,917 | * | 6/1998 | Grover et al. ........................... 106/3 |
| 5,783,489 | * | 7/1998 | Kaufman et al. ..................... 438/692 |
| 5,800,577 | * | 9/1998 | Kido ....................................... 51/308 |
| 5,868,604 | * | 2/1999 | Atsugi et al. .......................... 51/309 |
| 5,954,997 | * | 9/1999 | Kaufman et al. ................... 252/79.1 |

FOREIGN PATENT DOCUMENTS

| | | | |
|---|---|---|---|
| 831136 | * | 3/1998 | (EP) . |
| 10-46140 | * | 2/1998 | (JP) . |
| 10-172937 | * | 8/1998 | (JP) . |
| WO/96/16436 | * | 5/1996 | (WO) . |

* cited by examiner

*Primary Examiner*—C. Melissa Koslow
(74) *Attorney, Agent, or Firm*—Scully, Scott, Murphy & Presser

(57) ABSTRACT

The invention provides a chemical-mechanical abrasive composition for use in semiconductor processing, which comprises 70–95% by weight of an aqueous medium, 1–25% by weight of an abrasive, 0.1–20% by weight of an abrasion accelerator, wherein the abrasion accelerator comprises monocarboxy group- or an amido group-containing compound and optionally a nitrate salt. The chemical-mechanical abrasive composition of the invention can further comprise an anionic surfactant, e.g. polycarboxylic acid or polyacrylic acid copolymer, so as to reduce the viscosity of the abrasive composition.

17 Claims, No Drawings

CHEMICAL MECHANICAL ABRASIVE COMPOSITION FOR USE IN SEMICONDUCTOR PROCESSING

BACKGROUND OF THE INVENTION

1. Field of the Invention

The invention pertains to chemical mechanical abrasive compositions. The chemical mechanical abrasive compositions of the invention are useful in polishing the surface of a semiconductor wafer.

2. Description of the Prior Art

In the semiconductor industry, semiconductor wafer surface polishing is a universally used technique, because it enhances the smoothness on the semiconductor wafer and a dielectric layer and facilitates the production of wire circuits. In general, the polishing method for producing a wire circuit comprises mounting a semiconductor wafer on a spinning platen equipped with an abrasive head and applying an abrasive slurry comprising abrasive particles and an oxidant to the surface of the wafer to enhance the abrasive efficacy.

U.S. Pat. No. 5,225,034 discloses a chemical mechanical abrasive slurry which comprises $AgNO_3$, solid abrasive particles, and an oxidant selected from $H_2O_2$, HOCl, KOCl, $KMgO_4$, or $CH_3COOOH$. The slurry is used for polishing a copper layer on a semiconductor wafer so as to produce copper wire on the wafer.

U.S. Pat. No. 5,209,816 discloses a method for polishing an Al- or Ti-containing metal layer with a chemical mechanical abrasive slurry. The abrasive slurry contains, in addition to the solid abrasive material, about 0.1–20% by volume of $H_3PO_4$ and about 1–30% by volume of $H_2O_2$.

U.S. Pat. No. 4,959,113 discloses a method of using an aqueous abrasive composition for polishing metal surfaces. The aqueous abrasive composition comprises water, an abrasive, e.g. $CeO_2$, $Al_2O_3$, $ZrO_2$, $TiO_2$, $SiO_2$, SiC, $SnO_2$, or TiC, and a salt including a metal cation of Group IIA, IIIA, IVA or IVB and an anion of chloride, bromide, iodide, nitrate, sulfate, phosphate or perchlorate. This patent also discloses the use of hydrochloric acid, nitric acid, phosphoric acid or sulfuric acid to adjust the pH of the abrasive composition to be in the range of 1 to 6.

U.S. Pat. No. 5,391,258 discloses an abrasive composition for polishing silicon, silica or silicate composite. The abrasive composition comprises, in addition to abrasive particles, hydrogen peroxide and potassium hydrogen phthalate.

U.S. Pat. No. 5,114,437 discloses a polishing composition for an aluminum substrate comprising an alumina polishing agent having an average particle size of 0.2 to 5 $\mu$m, and a polishing accelerator selected from the group consisting of chromium(III) nitrate, lanthanum nitrate, ammonium cerium (III) nitrate, and neodymium nitrate.

U.S. Pat. No. 5,084,071 discloses a chemical mechanical polishing slurry for an electronic component substrate. The polishing slurry comprises abrasive particles (e.g. $SiO_2$, $CeO_2$, SiC, $Si_3N_4$, or $Fe_2O_3$ particles) containing no more than 1 percent weight of alumina, a transition metal chelated salt (e.g. ammonium iron EDTA) for use as a polishing accelerator, and a solvent for said salt.

U.S. Pat. No. 5,480,476 discusses the effect of Ce4+ and Zr4+ cations on the polishing rate of $SiO_2$-based abrasives.

U.S. Pat. No. 5,366,542 discloses a polishing composition comprising alumina abrasive particles, and a chelating agent selected from the group consisting of polyaminocarboxylic acid (e.g. EDTA) and sodium and potassium salts thereof. The composition may further comprise beohmit or an aluminum salt.

U.S. Pat. No. 5,340,370 discloses a chemical mechanical polishing slurry for tungsten or tungsten nitride film, which comprises an oxidizing agent such as potassium ferricyanide, an abrasive, and water, and has a pH between 2 and 4.

U.S. Pat. No. 5,516,346 discloses a slurry for chemical mechanically polishing a titanium film, said slurry comprising potassium fluoride in a concentration sufficient to complex said titanium film, and an abrasive, such as silica, and having a pH less than eight.

WO 96/16436 discloses a chemical mechanical polishing slurry which comprises abrasive particles having a median particle diameter less than 0.400 microns, a ferric salt oxidant, and a suspension agent of an aqueous surfactant which is a mixture of propyleneglycol and methylparaben.

U.S. Pat. No. 5,527,423 discloses a chemical mechanical slurry for polishing a metal layer, which comprises an oxidizing component such as iron nitrate, an aluminum particle comprising at least 50% gamma phase, and nonionic surfactants such as polyalkyl siloxanes, or polyoxyalkylene ethers.

It is known in the art that if the abrasive composition viscosity is too high to be flowable, the abrasive particles will deposit on the abrasive pad and be difficult to remove, possibly scratching the wafer surfaces. Although U.S. Pat. No. 5,527,423 discloses the use of nonionic surfactants, such as polyalkyl siloxanes or polyoxyalkylene ethers, these surfactants cannot effectively reduce the viscosity of the abrasive composition.

Accordingly, need still exists for abrasive compositions which are more economical and have high polishing performance, and for chemical mechanical abrasive compositions with reduced viscosity.

SUMMARY OF THE INVENTION

The present invention provides a chemical mechanical abrasive composition for semiconductor processing, which comprises 70–95% by weight of an aqueous medium, 1–25% by weight of an abrasive, and 0.1–20% by weight of an abrasion accelerator, wherein the abrasion accelerator comprises a monocarboxy group- or an amido group-containing compound and optionally a nitrate salt. The chemical mechanical abrasive composition of the present invention can further comprise an anionic surfactant, such as polycarboxylic acid or polyacrylic acid copolymer, or the salts thereof, to reduce the viscosity of the abrasive composition.

DETAILED DESCRIPTION OF THE INVENTION

The present invention provides a chemical mechanical abrasive composition for semiconductor processing, which comprises 70–95% by weight of an aqueous medium, 1–25% by weight of, preferably 3–10% by weight of, and more preferably 4–6% by weight of, an abrasive, and 0.1–20% by weight of, preferably 1–10% by weight of, and more preferably 2–5% by weight of, an abrasion accelerator, wherein the abrasion accelerator comprises a monocarboxy group- or an amido group-containing compound and optionally a nitrate salt.

The chemical mechanical abrasive composition of the present invention can further comprise 1–15% by weight of, and preferably 4–8% by weight of, an oxidant.

According to the present invention, the abrasive used in the abrasive composition can be any commercially available abrasive agent in particle form, such as $SiO_2$, $Al_2O_3$, $ZrO_2$, $CeO_2$, SiC, $Fe_2O_3$, $TiO_2$, $Si_3N_4$, or any mixture thereof.

The oxidant used in the abrasive composition, according to the present invention, can be any suitable commercial oxidant, such as peroxides, chlorates, chlorites, perchlorates, bromates, bromites, perbromate, nitrates, or the mixture thereof.

The monocarboxy group containing compound used in the abrasive composition according to the present invention is selected from:
(a) the monocarboxy group compound of the formula:

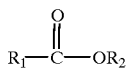

in which, $R_1$ is hydrogen, $C_1$–$C_6$ alkyl or $C_1$–$C_6$ hydroxyalkyl; and $R_2$ is hydrogen, ammonium, or alkali metal ions and preferably, potassium ion; or
(b) Aminoacid compounds.
Examples of the above compound (a) include formic acid, acetic acid, propionic acid, butyric acid, valeric acid, hexanoic acid, glycolic acid, lactic acid and the salts thereof Examples of the above aminoacid compounds (b) include glycine, sarcosine, dimethylglycine, alanine and the salts thereof. Further examples of aminoacid compounds (b) include mixtures of two or more of the above acids and/or their salts.

Examples of the amido group-containing compound used in the present invention as an abrasion accelerator include foramide, acetamide, propionamide, N-methylforamide, N-methylacetamide, urea, methylurea, ethylurea, dimethylurea and diethylurea.

The nitrate optionally used in the present invention is the alkali metal salt or ammonium salt well known to a person with ordinary skill in the art.

The abrasion accelerator used in the present invention comprises common chemicals which are less dangerous and would not cause a serious detriment to the health of the workers in semiconductor processing and to the environment.

It is believed that the viscosity of an abrasive composition will increase due to the formation of hydrogen bonds between the group Si—OH or Al—OH on the surfaces of the abrasive particles and the water molecule. Therefore, the viscosity of the abrasive composition could be reduced if a polymer is applied effectively and a film is formed on the surfaces of the abrasive particles so as to reduce the formation of hydrogen bonds between the abrasive particles and the water molecule.

Accordingly, according to another aspect of the present invention, there is provided a chemical mechanical abrasive composition with reduced viscosity. The said composition comprises 70–95% by weight of an aqueous medium, 1–25% by weight of an abrasive, 0.1–20% by weight of an abrasion accelerator, wherein the abrasion accelerator comprises monocarboxy group- or an amido group-containing compound and optionally a nitrate salt, and 0.01–1% by weight, and preferably 0.1–0.5% by weight of an anionic surfactant serving as a viscosity-reducing agent. The anionic surfactant which is suitable for the abrasive composition of the present invention is selected from polycarboxylic, the salts thereof; polyacrylic copolymer, the salts thereof; or a mixture containing two or more of these polymers and their salts.

According to the present invention, the above chemical mechanical abrasive composition may further comprise 1–15% by weight, and preferably 4–8% by weight, of an oxidant. According to a preferred embodiment of the present invention, the chemical mechanical abrasive composition of the present invention comprises 70–90% by weight of an aqueous medium, 4–6% by weight of an abrasive, 2–4% by weight of an abrasion accelerator, 4–8% by weight of an oxidant, and 0.1–0.5% by weight of a viscosity-reducing agent.

The abrasive composition of the present invention may use water as a medium. In the preparation of the abrasive composition, water, and preferably deionized water, may be used to make the composition into a slurry.

The abrasive composition of the present invention may further comprise those ingredients which are conventionally used in chemical mechanical abrasive art, only if they will not cause an adverse effect on the abrasive composition of the present invention. For example, when used in a copper production process, the abrasive composition of the present invention may include benzotriazole and/or its derivatives to inhibit rapid copper corrosion.

The abrasive composition of the present invention can be prepared by conventional methods. For example, an abrasive slurry can be prepared by first adding an abrasive to water and continuously stirring the mixture with a high shear force until the abrasive particles are completely suspended in the water. Thereafter, more water is added to the slurry such that the abrasive particles in the slurry are present in the desired solid content. According to the present invention, the solid content of the slurry is in the range from 1 to 25% by weight, and preferably 3 to 10% by weight. The additives described above are then introduced into the resultant slurry and the pH of the slurry is adjusted by, for example, ammonium hydroxide, to be in the desired range. For example, when the metal film to be polished is W film, the pH may be adjusted to be in the range of 1.5 to 2.5, and preferably in the range of 1.8 to 2.3; for Al film, the pH may be adjusted to be in the range of 3.0 to 4.5, and preferably in the range of 3.8 to 4.2; and for Cu film, the pH may be adjusted to be in the range of 3.0 to 4.5 or 6.0 to 7.0, and preferably in the range of 3.8 to 4.0 or 6.2 to 6.6. Finally, the resultant slurry is filtered to obtain the abrasive composition of the present invention. The preparation of the abrasive composition of the present invention can be carried out at any suitable temperature, and preferably at a temperature ranging from 20 to 40° C.

The present invention will be further described by, but not limited to, the following examples. Any modifications or changes with reference to the present invention which can be accomplished by persons skilled in the art will be covered in the domain of the present invention.

EXAMPLES

Example 1

5 Kg alumina particles (produced by Sumitomo Chemical Company, Model No. AKP-G008) was added to 20 Kg deionized water. The mixture was agitated continuously with a stirrer having a high shear force until the alumina particles were completely suspended in the water and a slurry was formed. 24.5 Kg deionized water was then added to dilute the slurry such that the solid content of the slurry was slightly higher than 10% by weight. Thereafter, 2.78 Kg ammonium persulfate and 2.78 Kg foramide were added to the slurry. After the slurry had been agitated for 30 minutes, the slurry was adjusted to have a pH of about 3.8. The slurry was then filtered to obtain the chemical mechanical abrasive composition of the present invention having a solid content of about 9% by weight. The result of abrasion test of the resultant compositions are listed below in Table 1.

Example 2

The preparation steps of Example 1 were repeated except that the foramide was replaced by 3.33 Kg propionic acid. The abrasion test results of the resultant compositions are listed below in Table 1.

Abrasion Test

A. Apparatus:
  IPEC/Westech 472
B. Conditions:
  Pressure: 5 psi
  Temperature: 25° C.
  Spindle speed: 50 rpm
  Platen speed: 55 rpm
  Pad type: Rodel IC 1400
  Slurry flow: 150 ml/min
C. Wafer:
  Al film: commercially available from Silicon Valley Microelectronics, Inc., which is obtained by CVD-depositing a film having the thickness of 0.85±5% micrometers on a 6 inches silicon wafer; and has the purity of: Al 98.5%, Si 1%, and Cu 0.5%
D. Slurry:
  Slurrys of Examples 1 and 2, which have the same volume and are aqueous solutions containing 5 wt % $H_2O_2$, and are tested after having been uniformly agitated for 15 minutes Abrasion Test Procedure Both before and after abrasion test, the thickness of the wafer to be polished should be measured by a thickness measuring means. The sheet resistivity of the metal film is measured by a 4-point probe. The thickness of the film is determined by the following formula:

$$T \times R = \text{resistivity coefficient}$$

wherein T represents film thickness (Å), and R represents sheet resistivity ($\Omega/cm^2$). For various metal films, the resistivity coefficient will be a constant.

The present invention used Model RS 75 of KLA-Tencor Company to determine the metal film thickness.

The film thickness of an oxide can be directly determined by the optical theory well known persons skilled in the art. The present invention used Model SM 300 of KLA-Tencor Company to determine the film thickness of an oxide.

The polishing rate is determined as follows:

A metal film thickness $T_1$ is first determined by the apparatus of Model RS75. The film is polished by an exemplified slurry under the above-mentioned conditions for 1 minute. Thereafter, the platen and the wafer are cleaned by the apparatus of Evergreen Model 10X produced by Solid State Equipment Corporation. After spray-drying the wafer, a metal film thickness $T_2$ is measured by the apparatus of Model RS75. The polishing rate of the exemplified slurry for the metal film is represented by $T_1-T_2$.

The test data are listed below in Table 1:

TABLE 1

| No. of Example | Al removal rate (Å/min) |
|---|---|
| Example 1 | 3854 |
| Example 2 | 4525 |

Example 3

An abrasive slurry having the following formula was prepared in a manner similar to that described in Example 1:

Abrasive particles: Silica (Aerosil 90 of Degussa)
  Solid content of the slurry: 6 wt %
  Ammonium nitrate: 3 wt %
  Urea: 3 wt %
  The slurry was adjusted with $HNO_3$ and $NH_4OH$ to have a pH of about 2.2.

The abrasion test result of the resultant abrasive composition is shown below in Table 2.

Comparative Example 1

An abrasive slurry having the following formula was prepared in a manner similar to that described in Example 3:

Abrasive particles: Silica (Aerosil 90 of Degussa)
  Solid content of the slurry: 6 wt %
  Ammonium nitrate: 3 wt %
  Oxalic acid: 3 wt %
  The slurry was adjusted with $HNO_3$ and $NH_4OH$ to have a pH of about 2.2.

The abrasion test result of the resultant abrasive composition is shown below in Table 2.

Abrasion Test

A. Apparatus:
  IPEC/Westech 472
B. Conditions:
  Down force: 7.5 psi
  Back pressure: 0 psi
  Temperature: 25° C.
  Platen speed: 50 rpm
  Carrier speed: 55 rpm
  Pad type: Rodel IC 1400, K-GRV
  Slurry flow: 150 ml/min
C. Wafer:
  W film: commercially available from Silicon Valley Microelectronics, Inc., which is obtained by CVD-depositing a film having the thickness of 0.85±5% micrometers on a 6 inches silicon wafer
D. Slurry:
  Slurrys of Example 3 and Comparative Example 1, which were mixed with 30 wt % $H_2O_2$ in the volume ratio of slurry to $H_2O_2$ of 5:1

The abrasion test procedures are substantially the same as described before. The resultant test data are listed below in Table 2.

TABLE 2

| No. of Example | W removal rate (Å/min) |
|---|---|
| Example 3 | 1548 |
| Comparative Example 1 | 617 |

In the process for producing IC copper circuits, Ta is most commonly used as a barrier metal film. Nevertheless, since Ta has a high chemical resistance, achieving effective polishing of Ta is usually difficult. It has been found that the abrasive composition of the present invention is able to provide excellent polishing efficacy for Ta. This polishing efficacy will be illustrated by the following examples.

Example 4

The same preparation steps of Example 1 were repeated except that 4.72 Kg alumina and 3.61 Kg ammonium persulfate were used and 2.50 Kg urea were substituted for foramide. The abrasion test results of the resultant compositions are listed below in Table 3.

Example 5

The same preparation steps of Example 4 were repeated except that 5.55 Kg silica (Aerosil 90, Degussa) was substituted for alumina and 4.44 Kg glycine was substituted for urea and 2.22 Kg ammonium persulfate was used. The abrasion test results of the resultant compositions are listed below in Table 3.

Example 6

The same preparation steps of Example 5 were repeated except that 2.78 Kg glycolic acid was substituted for glycine and ammonium persulfate. The abrasion test results of the resultant compositions are listed below in Table 3.

Example 7

The same preparation steps of Example 6 were repeated except that 1.65 Kg formic acid was substituted for glycolic acid. The abrasion test results of the resultant compositions are listed below in Table 3.

Example 8

The same preparation steps of Example 6 were repeated except that 2.78 Kg acetamide and 2.78 Kg ammonium nitrate were substituted for glycolic acid. The abrasion test results of the resultant compositions are listed below in Table 3.

Comparative Example 2

The same preparation steps of Example 4 were repeated except that 2.78 Kg citric acid was substituted for urea and 2.78 ammonium persulfate was used. The abrasion test results of the resultant compositions are listed below in Table 3.

Abrasion Test
A. Apparatus:
  IPEC/Westech 472
B. Conditions:
  Pressure: 5 psi
  Temperature: 25° C.
  Spindle speed: 50 rpm
  Platen speed: 55 rpm
  Pad type:
  Rodel IC 1000K-GRV
  Slurry flow: 150 ml/min
C. Wafer:
  Ta film: commercially available from Silicon Valley Microelectronics, Inc., which is obtained by CVD-depositing a film having the thickness of 0.5±5% micrometers on a 6 inches silicon wafer
D. Slurry:
  Slurrys of Examples 3 and 4 and Comparative Example 2, which were prepared to be in the same volume of aqueous solutions containing 7 wt % potassium bromate, and were tested after having been uniformly agitated for 15 minutes; and
  Slurrys of Examples 5–7, which were prepared to be in the same volume of aqueous solutions containing 5 wt % $H_2O_2$, and were tested after having been uniformly agitated for 15 minutes The abrasion test procedures are substantially the same as described before. The test data thus obtained are listed below in Table 3.

TABLE 3

| No. of Example | Ta removal rate (Å/min) |
| --- | --- |
| Example 4 | 352 |
| Example 5 | 502 |
| Example 6 | 471 |
| Example 7 | 1079 |
| Example 8 | 610 |
| Comparative Example 2 | 53 |

In view of the above examples, it is evident that the abrasive compositions according to the present invention can effectively enhance the polishing rate for metal films, and in particular W, Al and Ta films.

As described before, according to another embodiment of the present invention, the abrasive composition may further comprise an anionic surfactant to effectively reduce the viscosity of the abrasive composition. This embodiment will be illustrated by the following examples.

Example 9

2.4 Kg alumina particles as used in Example 1 was added to 30.9 Kg deionized water at room temperature. The mixture was agitated continuously with a stirrer having a high shear force until the alumina particles were completely suspended in the water and a slurry was formed. Thereafter, 3.2 Kg formic acid, 0.48 Kg Boemite (the trademark of an alumina commercialized by Condea Corporation), 1.6 Kg ammonium persulfate, and 0.03 Kg poly(ethylene glycol) (Aldrich Ar.20,240-1) were added in sequence to the slurry. The slurry was adjusted with $HNO_3$ or $NH_4OH$ to have a pH of about 3.8. The slurry was then filtered to obtain the chemical mechanical abrasive composition of the present invention. The results of the viscosity test of the resultant composition are listed below in Table 4.

Example 10

The preparation steps of Example 9 were repeated except that the poly(ethylene glycol) was replaced by 0.03 Kg BYK-022 (a polyalkylsiloxane). The slurry was then filtered to obtain the chemical mechanical abrasive composition of the present invention. The results of the viscosity test of the resultant composition are listed below in Table 4.

Example 11

The preparation steps of Example 9 were repeated except that the poly(ethylene glycol) was replaced by 0.03 Kg Dispex GA40 (produced by Allied Colloids Corporation). The slurry was then filtered to obtain the chemical mechanical abrasive composition of the present invention. The results of the viscosity test of the resultant composition are listed below in Table 4.

Comparative Example 3

The preparation steps of Example 9 were repeated except that no poly(ethylene glycol) was used. The results of the viscosity test of the resultant composition are listed below in Table 4.

Viscosity Test

One liter of each slurry of Examples 8–10 and Comparative Example 3 was tested by Brookfield Model LVF (No. 1, 60 rpm) for determining viscosity. The test results are shown below in Table 4.

TABLE 4

| No. of Example | Viscosity (cps) |
| --- | --- |
| Example 9 | 82.5 |
| Example 10 | 80 |
| Example 11 | 42.5 |
| Comparative Example 3 | 75 |

In view of the results shown in Table 4, it is known that the nonionic surfactants, such as polyalkylsiloxanes or polyoxyalkylene ethers, disclosed in U.S. Pat. No. 5,476,606 cannot effectively reduce the viscosity of abrasive compositions. According to the present invention, the viscosity of abrasive compositions can be effectively reduced by incorporating an anionic surfactant.

It is further understood that the present invention is not limited to the particular embodiments shown and described herein, but that various changes and modifications may be made without departing from the scope and spirit of the invention.

We claim:

1. A chemical mechanical abrasive composition for semiconductor processing comprising 70–95% by weight of an aqueous medium, 1–25% by weight of an abrasive, and 0.1–20% by weight of an abrasion accelerator, wherein the abrasion accelerator comprises an amido group-containing compound in combination with a nitrate salt.

2. The composition according to claim 1, wherein the abrasive is present in an amount of 3 to 10% by weight, and the abrasion accelerator is present in an amount of 1 to 6% by weight.

3. The composition according to claim 1 or 2, wherein the amido group-containing compound is selected from the group consisting of foramide, acetamide, propionamide, N-methylforamide, N-methylacetamide, urea, methylurea, ethylurea, dimethylurea and diethylurea.

4. The composition according to claim 1 or 2, further comprising 1 to 15% by weight of an oxidant.

5. The composition according to claim 4, wherein the oxidant is present in an amount of 4 to 6% by weight.

6. The composition according to claim 4, wherein the oxidant is selected from peroxides, chlorates, chlorites, perchlorates, bromates, bromites, perbromate, nitrates, and the mixture thereof.

7. The composition according to claim 1 or 2, wherein the abrasive is selected from the group consisting of $SiO_2$, $Al_2O_3$, $ZrO_2$, $CeO_2$, SiC, $Fe_2O_3$, $TiO_2$, $Si_3N_4$, and the mixture thereof.

8. A chemical mechanical abrasive composition for semiconductor processing comprising 70–95% by weight of an aqueous medium, 1–25% by weight of an abrasive, 0.1–20% by weight of an abrasion accelerator, wherein the abrasion accelerator comprises an amido group-containing compound in combination with a nitrate salt, and 0.01 to 1% by weight of an anionic surfactant.

9. The composition according to claim 8, wherein said anionic surfactant is selected from the group consisting of polycarboxylics, the salts thereof; polyacrylic copolymers, the salts thereof; and a mixture of two or more of these polymers and/or their salts.

10. The composition according to claim 8, wherein the abrasive is present in an amount of 3 to 10% by weight, and the abrasion accelerator is present in an amount of 1 to 6% by weight.

11. The composition according to any of claims 8–10, wherein the amido group-containing compound is selected from the group consisting of foramide, acetamide, propionamide, N-methylforamide, N-methylacetamide, urea, methylurea, ethylurea, dimethylurea and diethylurea.

12. The composition according to claim 8, further comprising 1 to 15% by weight of an oxidant.

13. The composition according to claim 12, wherein the oxidant is present in an amount of 4 to 6% by weight.

14. The composition according to claim 12, wherein the oxidant is selected from peroxides, chlorates, chlorites, perchlorates, bromates, bromites, perbromate, nitrates, and the mixture thereof.

15. The composition according to any of claims 8–10, wherein the abrasive is selected from the group consisting of $SiO_2$, $Al_2O_3$, $ZrO_2$, $CeO_2$, SiC, $Fe_2O_3$, $TiO_2$, $Si_3N_4$, and the mixture thereof.

16. The composition according to claim 12, comprising 70–90% by weight of said aqueous medium, 4–6% by weight of said abrasive, 2–4% by weight of said abrasion accelerator, 4–8% by weight of said oxidant, and 0.1–0.5% by weight of said anionic surfactant.

17. The composition according to claim 1 or 8, further comprising 0.05–0.2% by weight of benzotriazole and/or its derivatives.

* * * * *

UNITED STATES PATENT AND TRADEMARK OFFICE
CERTIFICATE OF CORRECTION

PATENT NO. : 6,171,352 B1
DATED : January 9, 2001
INVENTOR(S) : Tsung-Ho Lee, et al.

It is certified that error appears in the above-identified patent and that said Letters Patent is hereby corrected as shown below:

<u>Title page,</u>
Item [30], "(CN)" should read -- (TW) --

Signed and Sealed this

Twenty-seventh Day of November, 2001

Attest:

*Nicholas P. Godici*

NICHOLAS P. GODICI
*Acting Director of the United States Patent and Trademark Office*

*Attesting Officer*